United States Patent [19]

Hoshi

[11] E Patent Number: Re. 33,676

[45] Reissued Date of Patent: Aug. 27, 1991

[54] GATE ARRAY CIRCUIT FOR DECODING CIRCUITS

[75] Inventor: Toshiaki Hoshi, Tokyo, Japan

[73] Assignee: NEC Corporation, Tokyo, Japan

[21] Appl. No.: 596,151

[22] Filed: Oct. 11, 1990

Related U.S. Patent Documents

Reissue of:

[64] Patent No.: 4,777,390
Issued: Oct. 11, 1988
Appl. No.: 947,448
Filed: Dec. 29, 1986

[30] Foreign Application Priority Data

Dec. 27, 1985 [JP] Japan ..... 60-296948

[51] Int. Cl.[5] ..... H03K 17/693; H03K 19/003; H03K 19/094; H03K 17/04

[52] U.S. Cl. ..... 307/449; 307/463; 307/469; 364/716; 365/231

[58] Field of Search ..... 307/449, 463, 469, 465, 307/466, 467, 468, 443; 364/716; 365/104, 231

[56] References Cited

U.S. PATENT DOCUMENTS

| | | | |
|---|---|---|---|
| 4,031,477 | 6/1977 | Shaw | 307/469 X |
| 4,069,426 | 1/1978 | Hirasawa | 307/469 |
| 4,602,347 | 7/1986 | Koyama | 365/231 X |
| 4,625,130 | 11/1986 | Murray | 307/449 X |
| 4,675,556 | 6/1987 | Bazes | 307/449 X |

FOREIGN PATENT DOCUMENTS 0048834 3/1982 Japan .

*Primary Examiner*—Stanley D. Miller
*Assistant Examiner*—David R. Bertelson
*Attorney, Agent, or Firm*—Sughrue, Mion, Zinn, Macpeak & Seas

[57] ABSTRACT

A decoder circuit for decoding different combinations of supplied original input address bits, comprising at least one predecode circuit responsive to the original input address bits for producing predecoded signal bits from the input address bits, and a plurality of decoder units including at least one decoder unit responsive to at least two different combinations of the original input address bits, wherein the decoder units comprises a decoder unit responsive to selected ones of the predecoded signal bits alone and a decoder unit responsive to at least one of the predecoded signal bits and at least one of the original input address bits.

4 Claims, 6 Drawing Sheets

FIG. 2A

| ADDRESS BITS | DECODER UNITS | A5 | A4 | A3 | A2 | A1 | A0 |
|---|---|---|---|---|---|---|---|
| 0 | D0 | 0 | 0 | 0 | 0 | 0 | 0 |
| 1 | D1 | 0 | 0 | 0 | 0 | 0 | 1 |
| 4 | D2 | 0 | 0 | 0 | 0 | 1 | X |
| 8 | D3 | 0 | 0 | 0 | 0 | X | X |
| 16 | D4 | 0 | 0 | 1 | X | X | X |
| 24 | . . . | | | | | | |
| 32 | D5 | 0 | 1 | 1 | X | X | X |
| 36 | D6 | 1 | 0 | 0 | 0 | X | X |
| 40 | D7 | 1 | 0 | 0 | 1 | 0 | X |
| | D8 | 1 | 0 | 0 | 1 | 1 | 0 |
| | D9 | 1 | 0 | 0 | 1 | 1 | 1 |
| 48 | . . . | | | | | | |
| 56 | D10 | 1 | 1 | X | 0 | X | X |
| $2^6=64$ | D11 | 1 | 1 | X | 1 | X | X |

X: INDERINATE BIT (= 1 or 0)

GATE ARRAY CIRCUIT FOR DECODING CIRCUITS

Matter enclosed in heavy brackets [ ] appears in the original patent but forms no part of this reissue specification; matter printed in italics indicates the additions made by reissue.

FIELD OF THE INVENTION

The present invention relates to semiconductor devices and, more particularly, to a decoder circuit for use in a semiconductor memory device such as a read-only memory (ROM) or a random-access memory (RAM) which per se is well known in the art.

BACKGROUND OF THE INVENTION

A certain type of address decoder circuit for use in a semiconductor memory device such as a ROM or RAM device consists of decoder units of a number less than the number of the possible combinations of the bits forming an address signal to be supplied to the decoder circuit. A typical example of such a decoder circuit is the one used for a ROM device which is incorporated in a microprocessor to store microprogramming codes therein. Such a decoder circuit is directly responsive to the original input address signals so that, where each of the original input address signal consists of six bits, a maximum of $2^6=64$ different combinations or sequences of bits could be used in the decoder circuit. In comparison with such a large number of possible decoder outputs, the decoder circuit actually has a far smaller number of outputs such as, for example, only twelve outputs and, for this reason, requires the provision of a disproportionately large number of active devices or transistors. Such a large number of active devices used in the decoder circuit inevitably results in correspondingly large amounts of capacitances provided by the diffusion regions of the individual active devices and accordingly in reduction in the switching speed achievable of the decoder circuit.

An address decoder circuit of the described type thus sometimes uses a predecode scheme for the purpose of reducing the number of the transistors to be used in the decoder circuit and thereby increasing the switching speed achievable of the circuit. The decoder circuit to implement such a scheme comprises a suitable number of 2-bit predecode circuits which are directly responsive to the original input signal bits. Each of the 2-bit predecode circuits is operative to predecode neighboring two of the original input address bits by producing a total of four different logic ANDs of the two bits and the inverted versions of the two bits. The predecoded signal bits thus produced by the 2-bit predecode circuits are used in some of the decoder units so that only one of the two original input address bits which have resulted in each of the predecoded signal bits is effective in the particular decoder unit with the other of the two bits virtually neglected from use. The result is accordingly that there exits address bits which are not used in the decoder circuit. Such a scheme of the decoder circuit inevitably results in irregularities in the geometrical topology of the decoder circuit fabricated on a semiconductor chip.

It is, thus, an important object of the present invention to provide an improved decoder circuit which is composed of a minimized number of active devices to achieve an increased switching speed of the decoder circuit.

It is another important object of the present invention to provide an improved predecode decoder circuit which effectively uses the original input address bits supplied to the decoder circuit.

SUMMARY OF THE INVENTION

In accordance with one outstanding aspect of the present invention, there is provided a decoder circuit for decoding different combinations of supplied original input signal bits, comprising (a) at least one predecode circuit responsive to the original input signal bits for producing predecoded signal bits from the input signal bits, and (b) a plurality of decoder units including at least one decoder unit responsive to at least two different combinations of the original input signal bits, characterized in that the decoder units comprises a decoder unit responsive to the combination of at least one of the predecoded signal bits and at least one of the original input signal bits.

In accordance with another outstanding aspect of the present invention, there is provided a decoder circuit for decoding different combinations of supplied original input signal bits, comprising (a) at least one predecode circuit responsive to the original input signal bits for producing predecoded signal bits from the input signal bits, and (b) a plurality of decoder units including at least one decoder unit responsive to at least two different combinations of the original input signal bits, wherein the decoder units comprises a decoder unit responsive to selected ones of the predecoded signal bits alone and a decoder unit responsive to at least one of the predecoded signal bits and at least one of the original input signal bits.

In accordance with still another outstanding aspect of the present invention, there is provided a semiconductor decoder circuit including a plurality of decoder units for decoding different combinations of supplied original input signal bits, comprising (a) a first set of signal lines formed on a semiconductor structure, the first set of signal lines comprising a first group of signal lines connected to a source of a first predetermined voltage and a second group of signal lines connected to a source of a second predetermined voltage, (b) a second set of signal lines formed on a semiconductor structure and extending substantially at right angles to the first set of signal lines, the second set of signal lines comprising a third group of signal lines respectively responsive to predecoded signal bits predecoded from selected ones of the original input signal bits and a fourth group of signal lines respectively responsive to selected ones of the original input signal bits (c) a first set of field-effect transistors selectively connected in series to the source of the first predetermined voltage along each of the signal lines of the first group, each of the first set of field-effect transistors being of one channel conductivity type, and (d) a second set of field-effect transistors selectively connected in parallel to the source of the second predetermined voltage along each of the signal lines of the second group, each of the second set of field-effect transistors being of the channel conductivity type opposite to the one channel conductivity type, each of the second set of field-effect transistors having their gates selectively connected to the signal lines of the third and fourth groups, (e) the first set of field-effect transistors arranged along each of the signal lines of the first group and the second set of field-effect transistors arranged along each of the signal lines of the second group implementing each of the decoder units.

BRIEF DESCRIPTION OF THE DRAWINGS

The drawbacks of a prior-art address decoder circuit and the features and advantages of a decoder circuit according to the present invention will be more clearly understood from the following description taken in conjunction with the accompanying drawings in which:

FIGS. 2A and 2B are address maps depicting the schedules in accordance with which the decoder units of the decoder circuit shown in FIG. 1 are to produce output signal bits in response to the original address bits input to the decoder circuit, FIG. 2A showing such schedules in non-matrix form and FIG. 2B showing similar schedules in matrix form;

DESCRIPTION OF THE PRIOR ART

Figure 1:
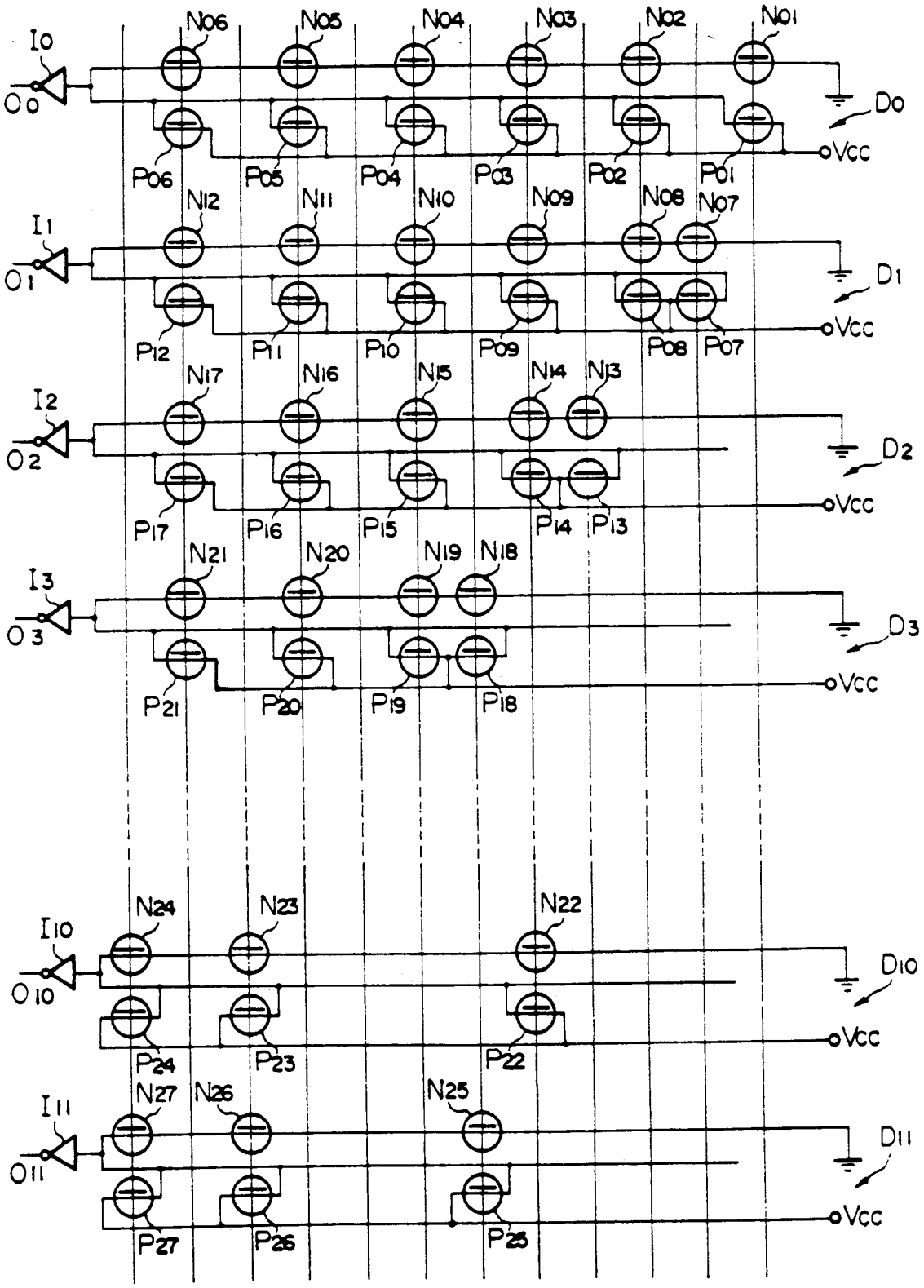
FIG. 1 PRIOR ART
FIG. 1 is a circuit diagram showing a typical known example of an address decoder circuit used for a ROM device storing microprogramming codes in a microprocessor.

As has been noted at the outset of the description, a certain type of address decoder circuit for use in a semiconductor memory device consists of decoder units of a number less than the number of the possible combinations of the bits forming an address signal to be supplied to the decoder circuit. FIG. 1 of the drawings shows a typical example of such a decoder circuit. The decoder circuit herein shown is used for a ROM device incorporated in a microprocessor for storing microprogramming codes therein and is by way of example assumed to be designed for use with a 12-word ROM device (not shown). The decoder circuit is made up of a number of n-channel field-effect transistors respectively denoted by $N_{01}$ to $N_{27}$ and p-channel field-effect transistors respectively denoted by $P_{01}$ to $P_{27}$. These n-channel and p-channel $N_{01}$ to $N_{27}$ and $P_{01}$ to $P_{27}$ are arranged to form twelve decoder units $D_0, D_1, D_2, \ldots D_{11}$ each including a plurality of full CMCS (complementary metal-oxide-semiconductor) inverters implemented by the field-effect transistors $N_{01}$ to $N_{27}$ and $P_{01}$ to $P_{27}$. The decoder units $D_0, D_1, D_2, \ldots D_{11}$ further include logic inverters $I_0$ to $I_{11}$, respectively, which provide output address bits of the individual decoder units $D_0$ to $D_{11}$, respectively. The decoder units $D_0$ to $D_{11}$ are responsive directly to original, viz., supplied address signals through a total of twelve signal input lines which consist of six lines respectively responsive to supplied address bits $A_0$ to $A_5$ and six lines respectively responsive to the inverted versions $\overline{A}_0$ to $\overline{A}_5$ of the supplied address bits $A_0$ to $A_5$. Each of the decoder units $D_0$ to $D_{11}$ consists of n-channel MOS field-effect transistors connected in series between ground and each of the logic inverters $I_0$ to $I_{11}$ and p-channel MOS field-effect transistors connected in parallel between a source of a supply voltage $V_{CC}$ and each of the inverters $I_0$ to $I_{11}$ as shown. The logic inverters $I_0$ to $I_{11}$ of the decoder units $D_0$ to $D_{11}$ are respectively connected to the word lines of the memory cell array (not shown).

Figure 2B:
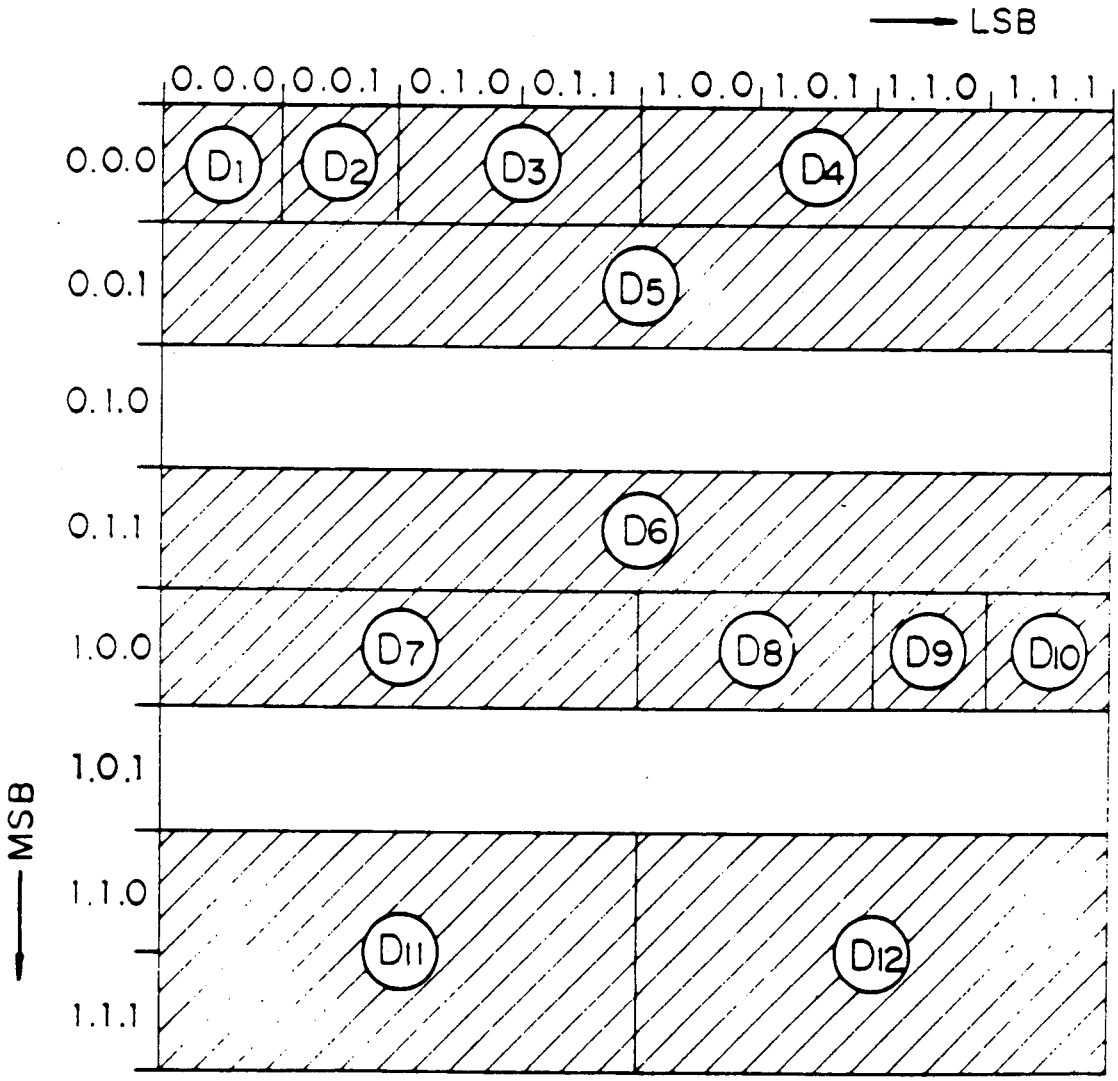

The n-channel field-effect transistors $N_{01}$ to $N_{27}$ and p-channel field-effect transistors $P_{01}$ to $P_{27}$ forming the decoder circuit are arranged so that the individual decoder units $D_0$ to $D_{11}$ of the decoder circuit are operative to produce output address bits $O_1$ to $O_{11}$ in response to the supplied address bits $A_0$ to $A_5$ and $\overline{A}_0$ to $\overline{A}_5$ in accordance with the schedules represented by an address map depicted in non-matrix form in FIG. 2A and in matrix form in FIG. 2B. The sign "X" in the non-matrix address map shown in FIG. 2A indicates an indeterminate or variable bit which may be of either logic "0" or "1" value. In the matrix address map shown in FIG. 2B, the axis of abscissa represents binary digits 000, 001, 011, . . . 111 (increasing from left to right) coded by the lower three of the six supplied address bits $A_0, A_1, A_2, \ldots A_5$ while the axis of ordinate represents binary digits (000, 001, 011, . . . 111 (increasing downwardly) coded by the upper three of the address bits $A_0$ to $A_5$. As will be seen from these address maps, each of the decoder units $D_2$ and $D_7$ of the address decoder circuit is operable for selecting one of two different sequences of address bits 000010 and 000011 ($D_2$) or 100100 and 100101 ($D_7$). On the other hand, each of the decoder units $D_3$ and $D_6$ is operable for selecting any one of four different sequences of address bits 000000, 00001, 000010 and 000011 ($D_3$) or 100000, 100001, 100010, 1000011 ($D_6$). Furthermore, each of the decoder units $D_4$, $D_5$, $D_{11}$ and $D_{12}$ is operable for selecting any one of a total of eight different sequences of address bits.

When an original input signal $A_0A_1A_2A_3A_4A_5$ in the form of, for example 00001X is supplied to the decoder circuit shown in FIG. 1, all the n-channel field-effect transistors $N_{13}$,$N_{14}$, $N_{15}$, $N_{16}$ and $N_{17}$ forming part of the decoder unit $D_2$ are turned on and all the associated p-channel field-effect transistors $P_{13}$, $P_{14}$, $P_{15}$, $P_{16}$ and $P_{17}$ of the decoder unit $D_2$ remain in non-conduction states. Under this condition, the decoder unit $D_2$ produces a logic "1" bit at the output terminal of the inverter $I_2$ as the output signal bit $O_2$ of the decoder unit $D_2$.

The known address decoder circuit thus constructed is directly responsive to the original input address signals, each of which consists of six bits yields a maximum of $2^6=64$ different combinations or sequences of bits. In comparison with such a large number of possible decoder outputs, the decoder circuit actually has only twelve outputs and, as a corollary of this, necessitates a disproportionately large number of active devices or transistors. As a matter of fact, the decoder unit $D_0$ which uses all the supplied address bits $A_0, A_1, A_2, \ldots A_5$ available is composed of a total of twelve transistors which consist of the three series connected n-channel field-effect transistors $N_{01}$ to $N_{06}$ and the three parallel connected p-channel field-effect transistors $N_{01}$ to $N_{06}$ and $P_{01}$ to $P_{06}$. Even each of the decoder units $D_{10}$ and $D_{11}$ (as well the decoder units $D_5$ and $D_6$ not shown) which uses the minimum number of input address bits is composed of a total of six field-effect transistors $N_{22}$ to $N_{24}$ and $P_{22}$ to $P_{24}$ or $N_{25}$ to $N_{27}$ and $P_{25}$ to $P_{27}$. Such a large number of field-effect transistors used in the decoder circuit inevitably results in correspondingly large amounts of capacitances provided by the source and drain diffusion regions of the transistors and accordingly in reduction in the switching speed achievable of the decoder circuit. This drawback of a known address decoder circuit is pronounced in a static decoder circuit implemented by full CMOS configuration as in the case of the prior-art decoder circuit shown in FIG. 1.

Whichever of NAND-based logics or NOR-based logics may be adopted in such a full CMOS address decoder circuit, either the n-channel field-effect transistors or the p-channel field-effect transistors implementing the decoder circuit must be connected in series. The larger the number of the series connected field-effect transistors, the lower the performance efficiencies of the individual transistors and accordingly the lower the switching speed of the entire decoder circuit.

Figure 3:
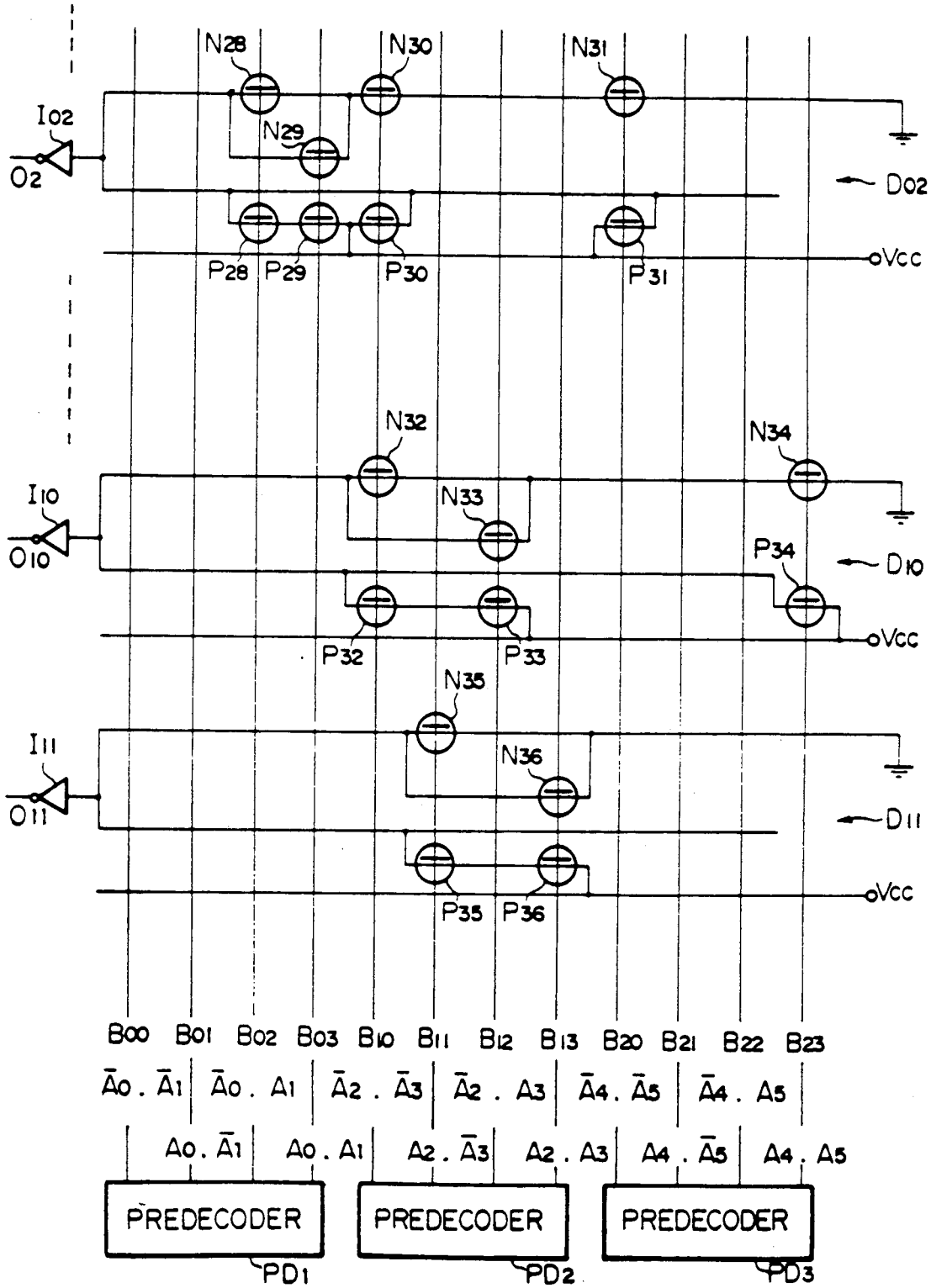
FIG. 3 is a circuit diagram showing a preferred example of an address decoder circuit which implements a two-bit predecode scheme.

Thus, an address decoder circuit of the type shown in FIG. 1 sometimes uses a predecode scheme for the purpose of reducing the number of the transistors to be used in the decoder circuit and thereby increasing the switching speed achievable of the circuit. FIG. 3 of the drawings shows a preferred example of an address decoder circuit which implements such a predecode scheme.

The decoder circuit herein shown is arranged to produce output address bits $O_0$ to $O_{11}$ responsive to original input address bits $A_0, A_1, A_2, \ldots A_5$ also in accordance with the schedules represented by the address map of FIGS. 2A or 2B. The decoder circuit is also assumed to comprise a total of twelve decoder units including the shown decoder units $D_2$, $D_{10}$ and $D_{11}$ which are formed by n-channel field-effect transistors $N_{28}$ to $N_{36}$ and p-channel field-effect transistors $P_{28}$ to $P_{36}$ and which include logic inverters including the inverters $I_2$, $I_{10}$ and $I_{11}$, respectively. The decoder circuit further comprises first, second and third 2-bit predecode circuits $PD_1$, $PD_2$ and $PD_3$ which are directly responsive to the original input signal bits $A_0, A_1, A_2, \ldots A_5$. Each of these 2-bit predecode circuits $PD_1$, $PD_2$ and $PD_3$ is operative to predecode neighboring two bits ($A_{2i}$ and $A_{2i+1}$ where $i=0$, 1 or 2) of the supplied original input address bits $A_0, A_1, A_2, \ldots A_5$. The first 2-bit predecode circuit $PD_1$ is responsive to the lower two $A_0$ and $A_1$ of the original input address bits $A_0, A_1, \ldots A_5$ to produce four different output bits $B_{00}$, $B_{01}$, $B_{02}$ and $B_{03}$ respectively representative of the logic ANDs $\overline{A}_0 \cdot \overline{A}_1$, $A_0 \cdot \overline{A}_1$, $\overline{A}_0 \cdot A_1$ and $A_0 \cdot A_1$ of the input bits $A_0$ and $A_1$ and the respective inverted versions thereof. The second 2-bit predecode circuit $PD_2$ is responsive to the intermediate two $A_2$ and $A_3$ of the original input address bits $A_0$ to $A_5$ to produce four different output bits $B_{10}$, $B_{11}$, $B_{12}$ and $B_{13}$ respectively representative of the logic ANDs $\overline{A}_2 \cdot \overline{A}_3$, $A_2 \cdot \overline{A}_3$, $\overline{A}_2 \cdot A_3$ and $A_2 \cdot A_3$ of the input bits $A_2$ and $A_3$ and the respective inverted versions thereof. The third 2-bit predecode circuit $PD_3$ is responsive to the intermediate two $A_4$ and $A_5$ of the original input address bits $A_0$ to $A_5$ to produce four different output bits $B_{20}$, $B_{21}$, $B_{22}$ and $B_{23}$ respectively representative of the logic ANDs $\overline{A}_4 \cdot \overline{A}_5$, $A_4 \cdot \overline{A}_5$ and $\overline{A}_4 \cdot A_5$ of the input bits $A_4$ and $A_5$ and the respective inverted versions thereof.

When an original input signal $A_0A_1A_2A_3A_4A_5$ in the form of, for example, 00001X is supplied to the decoder circuit thus constructed and arranged, the output bits $B_{02}$, $B_{03}$, $B_{10}$ and $B_{20}$ respectively representative of the logic ANDs $\overline{A}_0 \cdot A_1$, $A_0 \cdot A_1$, $\overline{A}_2 \cdot \overline{A}_3$ and $\overline{A}_4 \cdot \overline{A}_5$ of the supplied address bits assume logic "X", "X", "1" and "1" states. Of the field-effect transistors forming part of the decoder unit. $D_2$, for example, of the circuit shown in FIG. 3, the series connected n-channel field-effect transistors $N_{30}$ and $N_{31}$ and one of the parallel connected n-channel field-effect transistors $N_{28}$ and $N_{29}$ are thus turned on and the series connected p-channel field-effect transistors $P_{30}$ and $P_{31}$ and one of the parallel connected p-channel field-effect transistors $P_{28}$ and $P_{29}$ are held in non-conduction states. Under this condition, the decoder unit $D_2$ produces a logic "1" signal at the output terminal of the inverter $I_2$ as the output signal bit $O_2$ of the decoder unit $D_2$ as in the prior-art address decoder circuit shown in FIG. 1.

In the decoder units $D_2$ of the circuit shown in FIG. 3, the predecoded signal bits $B_{02}$ and $B_{03}$ produced by the first 2-bit predecode circuit $PD_1$ are supplied to the parallel combination of the n-channel field-effect transistors $N_{28}$ and $N_{29}$ of the decoder unit $D_2$ to produce a logic sum or OR, viz., $(\overline{A}_0 \cdot A_1 + A_0 \cdot A_1) = A_1$ of the supplied bits. The predecoded signal bits $B_{02}$ and $B_{03}$ are also supplied to the series combination of the p-channel field-effect transistors $P_{28}$ and $P_{29}$ of the decoder unit $D_2$ to produce a logic OR, viz., $(\overline{A}_0 \cdot A_1) + (A_0 \cdot A_1) = A_1$ of the supplied bits. Likewise, the predecoded signal bits $B_{10}$ and $B_{12}$ produced by the second 2-bit predecode circuit $PD_2$ are supplied to the parallel connected n-channel field-effect transistors $N_{32}$ and $N_{33}$ and series connected p-channel field-effect transistors $P_{32}$ and $P_{33}$ of the decoder unit $D_{10}$ to produce a logic OR, viz., $(\overline{A}_2 \cdot \overline{A}_3 + \overline{A}_2 \cdot A_3) = \overline{A}_2$ and a logic OR, viz., $(\overline{A}_2 \cdot \overline{A}_3) + (\overline{A}_2 \cdot A_3) = A_2$ of the supplied bits. In the decoder unit $D_{11}$, furthermore, a logic OR, viz., $(A_2 \cdot \overline{A}_3 + A_2 \cdot A_3) = A_2$ is produced in response to the predecoded signal bits $B_{10}$ and $B_{12}$ produced by the second 2-bit predecode circuit $PD_2$.

In the decoder circuit shown in FIG. 3, the neighboring two $A_{2i}$ and $A_{2i}$ of the supplied original input address bits $A_0, A_1, A_2, \ldots A_5$ are thus predecoded by each of the of 2-bit predecode circuits $PD_1$, $PD_2$ and $PD_3$ into signal bits $B_{00}$ to $B_{23}$ each of which is provided by the logic AND of the supplied address bit $A_{2i}$ or the inverted version thereof and the supplied address bit $A_{2i+l}$ or the inverted version thereof. The predecoded signal bits $B_{00}$ to $B_{23}$ are used in the decoder units $D_2$, $D_3$, $D_4$, $D_5$, $D_6$, $D_7$, $D_{10}$ and $D_{11}$ so that only one of the two original input address bits such as, for example, the address bit $A_1$ for the decoder unit $D_2$ or the address bit $A_2$ for the decoder unit $D_{10}$ or $D_{11}$ is effective in the particular decoder unit. This means that the other of the two bits $A_{2i}$ and $A_{2i}$ is virtually neglected from use. Such a scheme of the decoder circuit results in irregularities in the geometrical topology of the decoder circuit fabricated on a semiconductor chip because of the fact that the individual decoder units $D_0, D_1, D_2, \ldots D_{11}$ each of which should be configured by active devices and interconnections patterned with irregularity will differ in topology from one circuit to another.

The present invention contemplates elimination of such a problem inherent in a two-bit predecode decoder circuit of the described nature. Accordingly, the goal of the present invention is to provide an improved decoder circuit which is composed of a minimized number of active devices to achieve an increased switching speed of the decoder circuit and which effectively uses the original input address bits supplied to the decoder circuit, as previously noted.

DESCRIPTION OF THE PREFERRED EMBODIMENT

Figure 4:
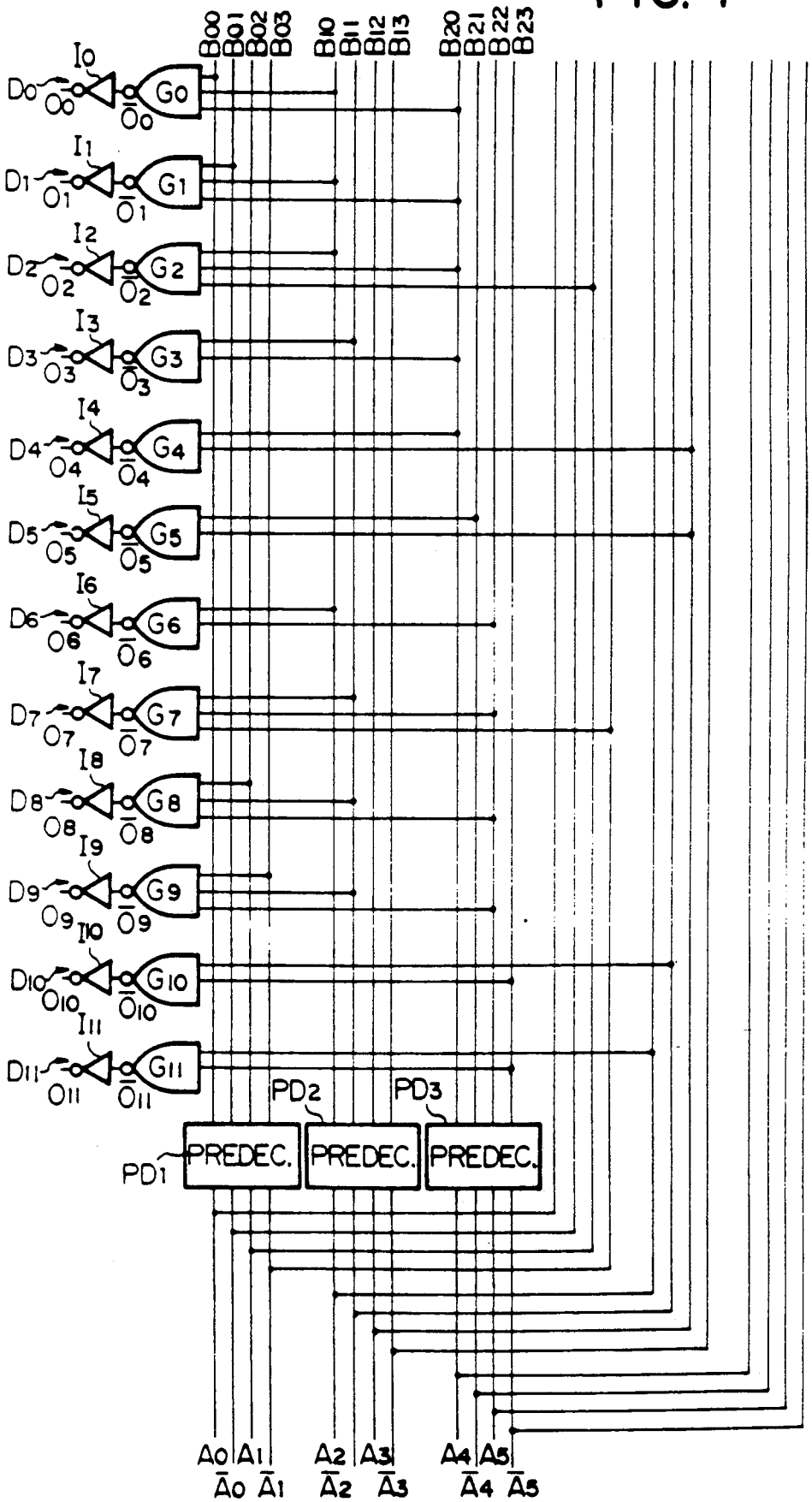
FIG. 4 is a schematic diagram showing the logical configuration of a preferred embodiment of a decoder circuit according to the present invention.

FIG. 4 of the drawings shows the logical configuration of a preferred embodiment of a decoder circuit according to the present invention. The decoder circuit herein shown is also assumed to be designed for use with a 12-word ROM device (not shown) by way of example and thus comprises twelve decoder units $D_0$, $D_1$, $D_2$, . . . $D_{11}$. The decoder units $D_0$, $D_1$, $D_2$, . . . $D_{11}$ in turn comprise two-input and three-input logic NAND gates $G_0$, $G_1$, $G_2$, . . . $G_{11}$, respectively, and logic inverters $I_0$, $I_1$, $I_2$, . . . $I_{11}$ respectively connected to the output terminals of the NAND gates $G_0$, $G_1$, $G_2$, . . . $G_{11}$ to provide output address bits of the individual decoder units $D_0$ to $D_{11}$.

The decoder circuit embodying the present invention further comprises first, second and third 2-bit predecode circuits $PD_1$, $PD_2$ and $PD_3$ which are directly responsive to original input signal bits $A_0$, $A_1$, $A_2$, . . . $A_5$ and the inverted versions $A_0$, $\overline{A}_1$, $\overline{A}_2$, . . . $\overline{A}_5$, respectively, thereof. Each of these 2-bit predecode circuits $PD_1$, $PD_2$ and $PD_3$ is operative to predecode neighboring two bits $A_{2i}$ and $A_{2i+1}$ of the supplied original input address bits $A_0$, $A_1$, $A_2$, . . . $A_5$ similarly to their counterparts in the decoder circuit described with reference to FIG. 3. Thus, the first 2-bit predecode circuit $PD_1$ is responsive to the lower two $A_0$ and $A_1$ of the original input address bits $A_0$, $A_1$, . . . $A_5$ to produce four different output bits $B_{00}$, $B_{01}$, $B_{02}$ and $B_{03}$ respectively representative of the logic ANDs $\overline{A}_0 \cdot \overline{A}_1$, $A_0 \cdot \overline{A}_1$, $A_0 \cdot \overline{A}_1$, $\overline{A}_0 \cdot A_1$ and $A_0 \cdot A_1$ of the input address bits $A_0$ and $A_1$ and the respective inverted versions thereof. The second 2-bit predecode circuit $PD_2$ is responsive to the intermediate two $A_2$ and $A_3$ of the original input address bits $A_0$ to $A_5$ to produce four different output bits $B_{10}$, $B_{11}$, $B_{12}$ and $B_{13}$ respectively representative of the logic ANDs $\overline{A}_2 \cdot \overline{A}_3$, $A_2 \cdot \overline{A}_3$, $\overline{A}_2 \cdot A_3$ and $A_2 \cdot A_3$ of the input address bits $A_2$ and $A_3$ and the respective inverted versions thereof. The third 2-bit predecode circuit $PD_3$ is responsive to the intermediate two $A_4$ and $A_5$ of the original input address bits $A_0$ to $A_5$ to produce four different output bits $B_{20}$, $B_{21}$, $B_{22}$ and $B_{23}$ respectively representative of the logic ANDs $\overline{A}_4 \cdot \overline{A}_5$, $A_4 \cdot \overline{A}_5$, $\overline{A}_5 \cdot A_5$ and $A_4 \cdot A_5$ of the input address bits $A_4$ and $A_5$ and the respective inverted versions thereof. The decoder circuit thus comprising the twelve NAND gates $G_0$ to $G_{11}$ are responsive to the original input address bits $A_0$ to $A_5$ and the respective inverted versions of these bits and to the signal bits $B_{00}$ to $B_{23}$ through a total of twelve input lines as shown. The individual decoder units $D_0$ to $D_{11}$ are implemented by full CMOS configuration and are operative to produce output address bits $O_1$ to $O_{11}$ in response to the supplied address bits $A_0$ to $A_5$ and $\overline{A}_0$ to $\overline{A}_5$ basically also in accordance with the schedules represented by the address maps depicted in FIGS. 2A and 2B.

Figure 5:
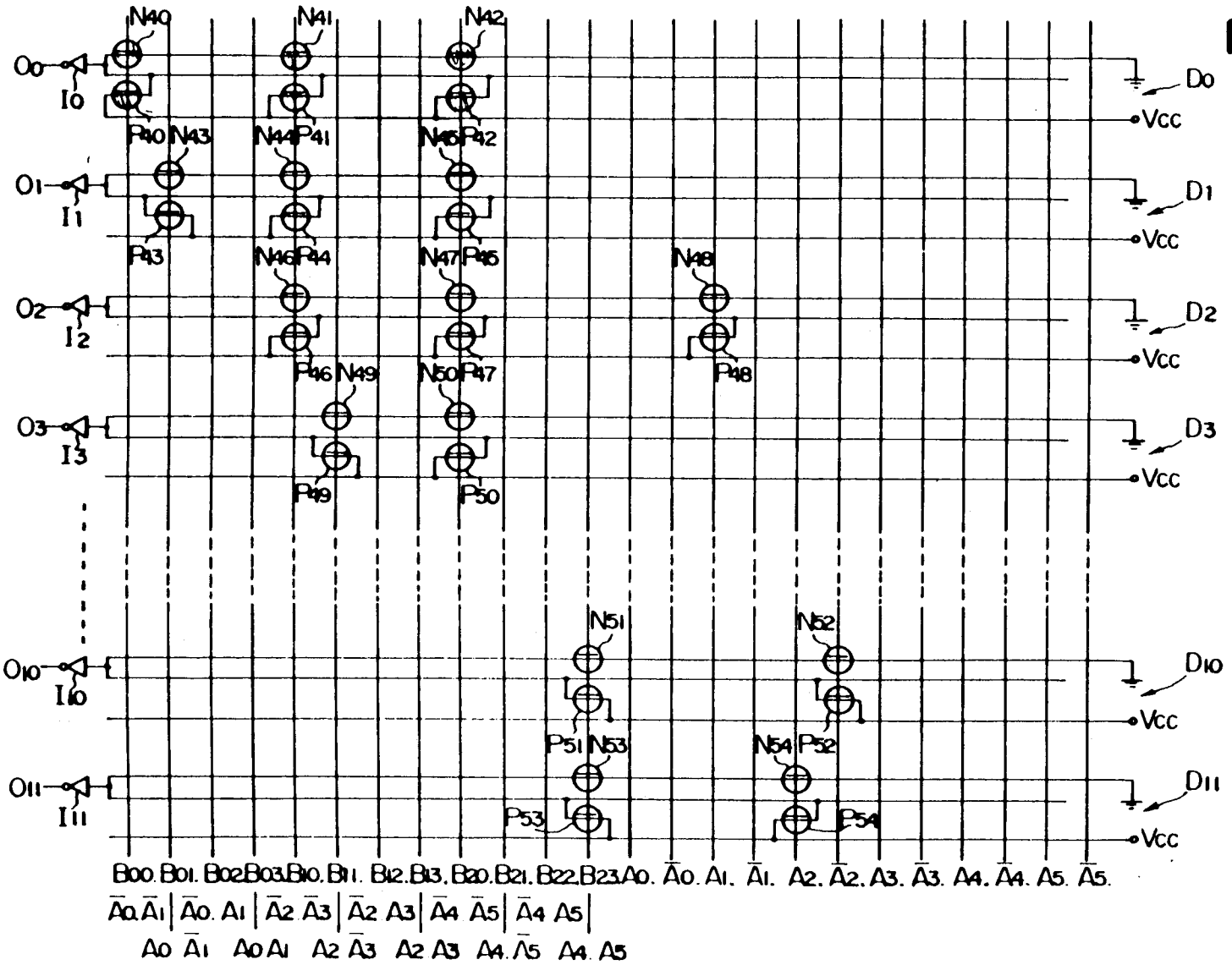
FIG. 5 is a circuit diagram showing a preferred example of the circuit arrangement implementing the logical configuration of the embodiment illustrated in FIG. 4.

FIG. 5 shows an example of the transistor circuit arrangement implementing the logical configuration of the decoder circuit thus constructed.

As shown, the three-input NAND gate $G_0$ of the decoder unit $D_0$ comprises three n-channel field-effect transistors $N_{40}$, $N_{41}$ and $N_{42}$ connected in series between the logic inverter $I_0$ and ground and three p-channel field-effect transistors $P_{40}$, $P_{41}$ and $P_{42}$ connected in parallel between the logic inverter $I_0$ and a source of a supply voltage $V_{CC}$. The field-effect transistors $N_{40}$ and $P_{40}$ have their gates responsive to the predecoded signal bit $B_{00}$, the field-effect transistors $N_{41}$ and $P_{41}$ have their gates responsive to the preselected signal bit $B_{10}$, and the field-effect transistors $N_{42}$ and $P_{43}$ have their gates responsive to the predecoded signal bit $B_{20}$.

The three-input NAND gate $G_1$ of the decoder unit $D_1$ comprises three n-channel field-effect transistors $N_{43}$, $N_{44}$ and $N_{45}$ connected in series between the logic inverter $I_1$ and ground and three p-channel field-effect transistors $P_{43}$, $P_{44}$ and $P_{45}$ connected in parallel between the logic inverter $I_1$ and the source of the supply voltage $V_{CC}$. The field-effect transistors $N_{43}$ and $P_{43}$ have their gates responsive to the predecoded signal bit $B_{01}$, the field-effect transistors $N_{44}$ and $P_{44}$ have their gates responsive to the predecoded signal bit $B_{10}$, and the field-effect transistors $N_{45}$ and $P_{45}$ have their gates responsive to the predecoded signal bit $B_{20}$.

The three-input NAND gate $G_2$ of the decoder unit $D_2$ comprises three n-channel field-effect transistors $N_{46}$, $N_{47}$ and $N_{48}$ connected in series between the logic inverter $I_2$ and ground and three p-channel field-effect transistors $P_{46}$, $P_{47}$ and $P_{48}$ connected in parallel between the logic inverter $I_2$ and the source of the supply voltage $V_{CC}$. The field-effect transistors $N_{46}$ and $P_{46}$ have their gates responsive to the predecoded signal bit $B_{10}$, the field-effect transistors $N_{47}$ and $P_{47}$ have their gates responsive to the predecoded signal bit $B_{20}$, and the field-effect transistors $N_{48}$ and $P_{48}$ have their gates responsive to the original input address bit $A_1$.

The two-bit NAND gate $G_3$ of the decoder unit $D_3$ comprises two n-channel field-effect transistors $N_{49}$ and $N_{50}$ connected in series between the logic inverter $I_3$ and ground and two p-channel field-effect transistors $P_{49}$ and $P_{50}$ connected in parallel between the logic inverter $I_3$ and the source of the supply voltage $V_{CC}$. The field-effect transistors $N_{49}$ and $P_{49}$ have their gates responsive to the predecoded signal bit $B_{11}$ and the field-effect transistors $N_{50}$ and $P_{50}$ have their gates responsive to the predecoded signal bit $B_{20}$.

As will be seen from FIG. 4, each of the two-input NAND gates $G_4$, $G_5$ and $G_6$ of the decoder units $D_4$, $D_5$ and $D_6$, respectively, comprises two n-channel field-effect transistors connected in series between each of the logic inverters $I_4$, $I_5$ and $I_6$ and ground and two p-channel field-effect transistors connected in parallel between each of the logic inverters $I_4$, $I_5$ and $I_6$ and the source of the supply voltage $V_{CC}$. One pair of n-channel and p-channel field-effect transistors of the NAND gate $G_4$ have their responsive to the predecoded signal bit $B_{20}$ and the other pair of n-channel and p-channel field-effect transistors of the NAND gate $G_4$ have their gates responsive to the original input address bit $A_3$. One pair of n-channel and p-channel field-effect transistors of the NAND gate $G_5$ have their gates responsive to the predecoded signal bit $B_{21}$ and the other pair of n-channel and p-channel field-effect transistors of the NAND gate $G_5$ have their gates also responsive to the original input address bit $A_3$. Furthermore, one pair of n-channel and p-channel field-effect transistors of the NAND gate $G_6$ have their gates responsive to the predecoded signal bit $B_{10}$ and the other pair of n-channel and p-channel field-effect transistors of the NAND gate $G_5$ have their gates responsive to the predecoded signal bit $B_{22}$.

As will be further seen from FIG. 4, each of the three-input NAND gates $G_7$, $G_8$ and $G_9$ of the decoder units $D_7$, $D_8$ and $D_9$, respectively, comprises three n-channel field-effect transistors connected in series between each of the logic inverters $I_7$, $I_8$ and $I_9$ and ground and two p-channel field-effect transistors connected in parallel between each of the logic inverters $I_7$, $I_8$ and $I_9$ and the source of the supply voltage $V_{CC}$. One pair of n-channel and p-channel field-effect transistors of the NAND gate $G_7$ have their gates responsive to the predecoded signal bit $B_{11}$, another pair of n-channel and p-channel field-effect transistors of the NAND gate $G_7$ have their gates responsive to the predecoded signal bit $B_{22}$, and the remaining pair of n-channel and p-channel field-effect transistors of the NAND gate $G_7$ have their gates responsive to the inverted address bit $\overline{A}_1$. One pair of n-channel and p-channel field-effect transistors of the NAND gate $G_8$ have their gates responsive to the predecoded signal bit $B_{02}$, another pair of n-channel and p-channel field-effect transistors of the NAND gate $G_8$ have their gates responsive to the predecoded signal bit $B_{11}$, and the remaining pair of n-channel and p-channel field-effect transistors of the NAND gate $G_8$ have their gates responsive to the predecoded signal bit $B_{22}$. Furthermore, one pair of n-channel and p-channel field-effect transistors of the NAND gate $G_9$ have their gates responsive to the predecoded signal bit $B_{03}$, another pair of n-channel and p-channel field-effect transistors of the NAND gate $G_9$ have their gates responsive to the predecoded signal bit $B_{11}$, and the remaining pair of n-channel and p-channel field-effect transistors of the NAND gate $G_9$ have their gates responsive to the predecoded signal bit $B_{11}$, and the remaining pair of n-channel and p-channel field-effect transistors of the NAND gate $G_8$ have their gates responsive to the predecoded signal bit $B_{22}$.

As shown in FIG. 5, the two-input NAND gate $G_{10}$ of the decoder unit $D_{10}$ comprises two n-channel field-effect transistors $N_{51}$ and $N_{52}$ connected in series between the logic inverter $I_{10}$ and ground and two p-channel field-effect transistors $P_{51}$ and $P_{52}$ connected in parallel between the logic inverter $I_{10}$ and the source of the supply voltage $V_{CC}$. The field-effect transistors $N_{51}$ and $P_{51}$ have their gates responsive to the predecoded signal bit $B_{23}$ and the field-effect transistors $N_{52}$ and $P_{52}$ have their gates responsive to the inverted address bit $\overline{A}_2$. Lastly, the two-input NAND gate $G_{11}$ of the decoder unit $D_{11}$ comprises two n-channel field-effect transistors $N_{53}$ and $N_{54}$ connected in series between the logic inverter $I_{11}$ and ground and two p-channel field-effect transistors $P_{53}$ and $P_{54}$ connected in parallel between the logic inverter $I_{11}$ and the source of the supply voltage $V_{CC}$. The field-effect transistors $N_{53}$ and $P_{53}$ have their gates also responsive to the predecoded signal bit $B_{23}$ and the field-effect transistors $N_{54}$ and $P_{54}$ have their gates responsive to the original input address bit $A_2$ as shown.

It may be herein noted that FIG. 5 herein presented shows not only the general circuit arrangement or interconnections between the individual transistors used but also a preferred example of the layout of the transistors arranged in rows and columns on a semiconductor integrated circuit chip in conjunction with the terminals providing the supply voltage source and ground lines.

The active devices of the decoder circuit being thus arranged, the respective NAND gates $G_0$ to $G_{11}$ of the decoder units $D_0$ to $D_{11}$ are operative to produce output bits $\overline{O}_0$ to $\overline{O}_{11}$ in accordance with the schemes represented by the following Boolean expressions:

$$\overline{O}_0=(\overline{A}_0\cdot\overline{A}_1)\cdot(\overline{A}_2\cdot\overline{A}_3)\cdot(\overline{A}_4\cdot\overline{A}_5)=\overline{A}_0\cdot\overline{A}_1\cdot\overline{A}_2\cdot\overline{A}_3\cdot\overline{A}_4\cdot\overline{A}_5$$
$$\overline{O}_1=(A_0\cdot\overline{A}_1)\cdot(\overline{A}_2\cdot\overline{A}_3)\cdot(\overline{A}_4\cdot\overline{A}_5)=A_0\cdot\overline{A}_1\cdot\overline{A}_2\cdot\overline{A}_3\cdot\overline{A}_4\cdot\overline{A}_5$$
$$\overline{O}_2=A_1\cdot(\overline{A}_2\cdot\overline{A}_3)\cdot(\overline{A}_4\cdot\overline{A}_5)=A_1\cdot\overline{A}_2\cdot\overline{A}_3\cdot\overline{A}_4\cdot\overline{A}_5$$
$$\overline{O}_3=(A_2\cdot\overline{A}_3)\cdot(\overline{A}_4\cdot\overline{A}_5)=A_2\cdot\overline{A}_3\cdot\overline{A}_4\cdot\overline{A}_5$$
$$\overline{O}_4=A_3\cdot(\overline{A}_4\cdot\overline{A}_5)=A_3\cdot\overline{A}_4\cdot\overline{A}_5$$
$$\overline{O}_5=A_3\cdot(A_4\cdot\overline{A}_5)=A_3\cdot A_4\cdot\overline{A}_5$$
$$\overline{O}_6=(\overline{A}_2\cdot\overline{A}_3)\cdot(\overline{A}_4\cdot A_5)=\overline{A}_2\cdot\overline{A}_3\cdot\overline{A}_4\cdot\overline{A}_5$$
$$\overline{O}_7=\overline{A}_1\cdot(A_2\cdot\overline{A}_3)\cdot(\overline{A}_4\cdot A_5)=\overline{A}_1\cdot A_2\cdot\overline{A}_3\cdot\overline{A}_4\cdot A_5$$
$$\overline{O}_8=(\overline{A}_0\cdot A_1)\cdot(A_2\cdot\overline{A}_3)\cdot(\overline{A}_4\cdot A_5)=\overline{A}_0\cdot A_1\cdot A_2\cdot\overline{A}_3\cdot\overline{A}_4\cdot A_5$$
$$\overline{O}_9=(A_0\cdot A_1)\cdot(A_2\cdot\overline{A}_3)\cdot(\overline{A}_4\cdot A_5)=A_0\cdot A_1\cdot A_2\cdot\overline{A}_3\cdot\overline{A}_4\cdot A_5$$
$$\overline{O}_{10}=A_2\cdot(A_4\cdot A_5)=\overline{A}_2\cdot A_4\cdot A_5$$
$$\overline{O}_{11}=A_2\cdot(A_4\cdot A_5)=A_2\cdot A_4\cdot A_5$$

As will be seen from the address maps of FIGS. 2A and 2B, the address bits $O_0$ to $O_{11}$ produced by the individual decoder units $D_0$ to $D_{11}$, viz., appearing at the output terminals of the logic inverters $I_0$ to $I_{11}$, respectively, assume logic "0" values as follows:

The output address bit $O_0$ assumes a logic "0" value when all of the original input address bits $A_0$ to $A_5$ are of logic "0". The output address bit $O_1$ assumes a logic "0" value when the original input address bit $A_0$ is of a logic "1" value and each of the remaining original input address bits $A_1$ to $A_5$ is of a logic "0" value. The output address bit $O_2$ assumes a logic "0" value without respect to the original input address bit $A_0$ when the original input address bit $A_1$ is of a logic "1" value and each of the remaining original input address bits $A_2$ to $A_5$ is of a logic "0" value. The output address bit $O_3$ assumes a logic "0" value without respect to the original input address bits $A_0$ and $A_1$ when the original input address bit $A_2$ is of a logic "1" value and each of the remaining original input address bits $A_3$ to $A_5$ is of a logic "0" value. The output address bit $O_4$ assumes a logic "0" value without respect to the original input address bits $A_0$ to $A_2$ when the original input address bit $A_3$ is of a logic "1" value and each of the remaining original input address bits $A_4$ and $A_5$ is of a logic "0" value. The output address bit $O_5$ assumes a logic "0" value without respect to the original input address bits $A_0$ to $A_2$ when each of the original input address bits $A_3$ and $A_4$ is of a logic "1" value and the remaining original input address bit $A_5$ is of a logic "0" value. The output address bit $O_6$ assumes a logic "0" value without respect to the original input address bits $A_0$ and $A_1$ when each of the original input address bits $A_2$ to $A_4$ is of a logic "0" value and the remaining original input address bit $A_5$ is of a logic "1" value. The output address bit $O_7$ assumes a logic "0" value without respect to the original input address bit $A_0$ when the original input address bits $A_1$, $A_3$ and $A_4$ is of a logic "0" value and each of the remaining original input address bits $A_2$ and $A_5$ is of a logic "1" value. The output address bit $O_8$ assumes a logic "0" value when each of the original input address bits $A_0$, $A_3$ and $A_4$ is of a logic "0" value and each of the remaining original input address bits $A_1$, $A_2$ and $A_5$ is of a logic "1" value. The output address bit $O_9$ assumes a logic "0" value when each of the original input address bits $A_0$, $A_1$, $A_2$ and $A_5$ is of a logic "1" value and each of the remaining original input address bits $A_3$ and $A_5$ is of a logic "0" value. The output address bit $O_{10}$ assumes a logic "0" value without respect to the original input address bits $A_0$, $A_1$ and $A_3$ when the original input address bit $A_2$ is of a logic "0" value and each of the remaining original input address bits $A_4$ and $A_5$ is of a logic "1" value. The output address bit $O_{11}$ assumes a logic "0" value without respect to the original input address bits $A_0$, $A_1$ and $A_3$ when all the remaining input address bits $A_2$, $A_4$ and $A_5$ are of logic "1" values.

Thus, each of the decoder units $D_0$, $D_1$, $D_8$ and $D_9$ is responsive to all of the six supplied original input address bits $A_0$ to $A_5$. Accordingly, each of these decoder units $D_0$, $D_1$, $D_8$ and $D_9$ is responsive to a single unique sequence or combination of the input address bits and is accordingly comprised of a three-input NAND gate responsive to three of the predecoded signal bits alone. Each of the decoder units $D_2$ and $D_7$ is not responsive to one of the supplied original input address bits $A_0$ to $A_5$ and is thus responsive to two different sequences or combinations of the input address bits. Each of these two decoder units $D_2$ and $D_7$ may therefore be comprised of a three-input NAND gate responsive to two of the predecoded signal bits and one of the original input address bits. Each of the decoder units $D_3$ and $D_6$ is not responsive to two of the supplied original input address bits $A_0$ to $A_5$ and is thus responsive to four different sequences or combinations of the input address bits and may therefore be comprised of a two-input NAND gate for being responsive to two of the predecoded signal bits alone. Each of the decoder units $D_4$, $D_5$, $D_{10}$ and $D_{11}$ is not responsive to three of the supplied original input address bits $A_0$ to $A_5$ and is responsive to eight different sequences or combinations of the input address bits. Each of these decoder units $D_4$, $D_5$, $D_{10}$ and $D_{11}$ may therefore be also comprised of a two-input NAND gate for being responsive to one of the predecoded signal bits and one of the original input address bits.

From the above discussion it will have been understood that the decoder units $D_0$ to $D_{11}$ of the decoder circuit embodying the present invention are broken down to four different categories which consist of a first category including the decoder units $D_0$, $D_2$, $D_8$ and $D_9$ each including a three-input NAND gate responsive to predecoded signal bits alone, a second category including the decoder units $D_3$ and $D_6$ each including a two-input NAND gate also responsive to predecoded signal bits alone, a third category including the decoder units $D_2$ and $D_7$ each including a three-input NAND gate responsive to predecoded signal bits and an original input address bit, and a fourth category including the decoder units $D_4$, $D_5$, $D_{10}$ and $D_{11}$ each including a two-input NAND gate responsive to a predecoded signal bit and an original input address bit. In each of the decoder units $D_2$ and $D_7$ which fall within the third category, the original input address bit used directly by the decoder unit is selected from the bits other than those which have resulted in the two predecoded signal bits used by the decoder unit. In each of the decoder units $D_4$, $D_5$, $D_{10}$ and $D_{11}$ which fall within the fourth category, the original input address bit used is also selected from the bits other than those which have resulted in the single predecoded signal bit used by the decoder unit.

As will have been seen from the foregoing description, the decoder circuit embodying the present invention is characterized in that, inter alia, the predecoded signal bits are used in combination with the original input address bits in most of the decoder units such as the decoder units $D_2$, $D_4$, $D_5$, $D_7$, $D_{10}$ and $D_{11}$. For this reason, each of the decoder units $D_0$ to $D_{11}$ of the decoder circuit embodying the present invention can be implemented by a two-input or three-input NAND gate and can accordingly be composed of only two or three CMOS transistor parts in addition to the associated logic converter. Such a configuration of the decoder circuit embodying the present invention is prominently contrasted by a prior-art address decoder circuit which includes more than three CMOS transistor pairs as described with reference to FIG. 1. A decoder circuit according to the present invention is thus advantageous for its simplicity of construction and accordingly for the reduced switching time achievable of the decoder circuit over a prior-art decoder circuit of the described nature. The reduction in the number of series connected n-channel field-effect transistors of each of the decoder units significantly contributes to reduction in the transconductance (gm) of the decoder unit as a whole and will make it possible further reduce the switching time of the decoder circuit.

While the predecode circuits used in the described embodiment of a decoder circuit have been assumed to be of the two-bit predecode type, any other types of predecode circuits such as six-bit or three-bit predecode circuits may alternatively be used in a decoder circuit according to the present invention.

Furthermore, all of the input lines for the original input address bits and the inverted versions thereof have been shown connected to the decoder circuit but, if desired, only those for the original input address bits $A_1$, $A_2$ and $A_3$ and the inverted version $\overline{A}_2$ of the original input address bit $A_2$ which are used directly by the decoder circuit may be connected to the decoder circuit. In this instance, the other input lines may be connected only to the predecode circuit $PD_1$, $PD_2$ and $PD_3$ without being extended far to the decoder units per se.

What is claimed is:

1. A decoder circuit for decoding different combinations of supplied original input signals on input signal lines, comprising at least one predecode circuit coupled to said input signal lines for producing predecoded output signals on output lines of said predecode circuit, and a plurality of decoder units including [at least one decoder unit coupled to at least two different combinations of said input signal lines, and] at least one decoder unit coupled to the combination of at least one of said output lines and at least one of said input signal lines.

2. A decoder circuit for decoding different combinations of supplied original input signals on input signal lines, comprising at least one predecode circuit coupled to said input signal lines for producing predecoded output signals on output lines of said predecode circuit, and a plurality of decoder units including [at least one decoder unit coupled to at least two different combinations of said input signal lines,] at least one decoder unit coupled to selected ones of said output signal lines alone and a decoder unit coupled to at least one of said output signal lines and at least one of said input signal lines.

3. A decoder circuit as set forth in claim 1 or 2, in which each of said plurality of decoder units comprises a logic NAND gate.

4. A semiconductor decoder circuit including a plurality of decoder units for decoding different combinations of supplied original input signals on input signal lines, comprising:

a first set of signal lines formed on a semiconductor structure, the first set of signal lines comprising a first group of signal lines connected to a source of a first predetermined voltage and a second group of signal lines connected to a source of a second predetermined voltage, a second set of signal lines formed on a semiconductor structure and extending substantially at right angles to said first set of signal lines, the second set of signal lines comprising a third group of signal lines respectively coupled to output signal lines having output signals predecoded from the input signals on selected ones of said input signal lines and a fourth group of signal lines respectively coupled to the input signals on selected ones of said input signal lines, a first set of field-effect transistors selectively connected in series to the source of said first predetermined voltage along each of the signal lines of said first predetermined voltage along each of the signal lines of said first group, each of the first set of field-effect transistors being of one channel conductivity type, and a second set of field-effect transistors selectively connected in parallel to the source of said second predetermined voltage along each of the signal lines of said second group, each of the second set of field-effect transistors being of the channel conductivity type opposite to said one channel conductivity type, the second set of field-effect transistors having their gates selectively connected to the signal lines of said third and fourth groups, the first set of field-effect transistors arranged along each of the signal lines of said first group and the second set of field-effect transistors arranged along each of the signal lines of said second group implementing each of said decoder units.

* * * * *